US008367274B2

(12) United States Patent
Yoshinari et al.

(10) Patent No.: US 8,367,274 B2
(45) Date of Patent: *Feb. 5, 2013

(54) HOLOGRAM RECORDING MATERIAL, AND HOLOGRAM RECORDING MEDIUM

(75) Inventors: Jiro Yoshinari, Tokyo (JP); Naoki Hayashida, Tokyo (JP)

(73) Assignee: TDK Corporation, Tokyo (JP)

( * ) Notice: Subject to any disclaimer, the term of this patent is extended or adjusted under 35 U.S.C. 154(b) by 969 days.

This patent is subject to a terminal disclaimer.

(21) Appl. No.: 11/556,813

(22) Filed: Nov. 6, 2006

(65) Prior Publication Data

US 2007/0111107 A1 May 17, 2007

(30) Foreign Application Priority Data

Nov. 11, 2005 (JP) ................................ 2005-328192

(51) Int. Cl.
*G03C 1/72* (2006.01)
*G03H 1/04* (2006.01)

(52) U.S. Cl. .......... 430/1; 430/2; 430/280.1; 430/281.1; 359/3

(58) Field of Classification Search ........................ None
See application file for complete search history.

(56) References Cited

U.S. PATENT DOCUMENTS

| | | | | |
|---|---|---|---|---|
| 4,942,112 A * | 7/1990 | Monroe et al. | ............. | 430/282.1 |
| 5,292,620 A * | 3/1994 | Booth et al. | ................... | 430/290 |
| 6,268,089 B1 | 7/2001 | Chandross et al. | | |
| 6,524,771 B2 * | 2/2003 | Maeda et al. | ................. | 430/290 |
| 7,767,361 B2 | 8/2010 | Mizushima | | |
| 7,883,821 B2 | 2/2011 | Kosuda et al. | | |
| 7,932,000 B2 | 4/2011 | Hayashida et al. | | |
| 7,939,221 B2 | 5/2011 | Kosuda et al. | | |
| 8,021,800 B2 * | 9/2011 | Kosuda et al. | ..................... | 430/2 |
| 8,080,348 B2 * | 12/2011 | Hayashida et al. | ............... | 430/1 |
| 2002/0110740 A1 * | 8/2002 | Otaki et al. | ........................ | 430/1 |
| 2003/0044691 A1 * | 3/2003 | Setthachayanon et al. | ....... | 430/1 |

(Continued)

FOREIGN PATENT DOCUMENTS

| | | |
|---|---|---|
| JP | 2953200 | 7/1999 |
| JP | 11-344917 | 12/1999 |
| JP | 2002-236439 | 8/2002 |
| JP | 3473950 | 9/2003 |
| JP | 2005-321673 | * 11/2005 |
| JP | 2005-321674 | * 11/2005 |
| WO | WO 99/26112 | 5/1999 |
| WO | WO 2005/109115 A1 | 11/2005 |
| WO | WO 2005/109116 A1 | 11/2005 |

OTHER PUBLICATIONS

Yoon et al., "Effect of acrylate monomers on the diffraction behavior of photopoymers fabricated with cellulose ester polymer binder", Opt. Mat., vol. 27 pp. 1190-1196 (on-line Nov. 2004).*

(Continued)

*Primary Examiner* — Martin Angebranndt
(74) *Attorney, Agent, or Firm* — Oblon, Spivak, McClelland, Maier & Neustadt, L.L.P.

(57) ABSTRACT

The present invention provides a hologram recording material which attains high refractive index change, flexibility, high sensitivity, low scattering, environment resistance, durability, low shrinkage, and high multiplicity, and is suitable for volume hologram recording. Also, the present invention provides a hologram recording medium. A hologram recording material comprising: an organometallic compound at least containing at least two kinds of metals, oxygen, and an aromatic group, and having an organometallic unit wherein two aromatic groups are bonded directly to one metal; and a photopolymerizable compound containing at least a monofunctional compound (A) having one polymerizable functional group in the molecule. The hologram recording material may comprise, as the photopolymerizable compound, a polyfunctional compound (B) having two or more polymerizable functional groups in the molecule. A hologram recording medium 11 has a hologram recording material layer 21.

9 Claims, 1 Drawing Sheet

U.S. PATENT DOCUMENTS

| | | | |
|---|---|---|---|
| 2005/0036179 A1* | 2/2005 | Chisholm et al. | 359/3 |
| 2006/0172203 A1 | 8/2006 | Mizushima | |
| 2007/0111108 A1* | 5/2007 | Hayashida et al. | 430/1 |
| 2007/0243473 A1* | 10/2007 | Mizushima et al. | 430/2 |
| 2007/0243474 A1* | 10/2007 | Mizushima et al. | 430/2 |
| 2008/0057404 A1* | 3/2008 | Kosuda et al. | 430/2 |
| 2008/0057405 A1* | 3/2008 | Yoshinari et al. | 430/2 |
| 2008/0076033 A1 | 3/2008 | Hayashida et al. | |
| 2008/0160421 A1 | 7/2008 | Hayashida et al. | |
| 2008/0254375 A1 | 10/2008 | Hayashida et al. | |
| 2008/0268349 A1 | 10/2008 | Kosuda et al. | |
| 2009/0091810 A1 | 4/2009 | Yoshinari et al. | |
| 2009/0092904 A1 | 4/2009 | Hayashida et al. | |
| 2009/0097085 A1 | 4/2009 | Hayashida et al. | |
| 2009/0186281 A1 | 7/2009 | Kosuda et al. | |
| 2010/0086859 A1 | 4/2010 | Hayashida et al. | |
| 2011/0287343 A1 | 11/2011 | Hayashida et al. | |

OTHER PUBLICATIONS

Luo et al. "synthesis of photosensitive organic-inorganic hybrid polymers via anhydrous sol-gel process for integrated optics". Mat. Res. Soc. Symp. Proc. vol. 780 pp. 169-174 (2003) paper Y4.11.*

Luo et al. "Anhydrous sol-gel synthesis of titania doped siloxane polymer for integrated optics", J. Sol-Gel Sci. & Technol. vol. 32 pp. 297-301 (2004).*

12th International sol-gel workshop (sydney, AU) Aug. 2003 (15 pages).*

Hawley's Condensed Chemical Dictionary, $12^{th}$ Ed. pp. 856 (1993).*

U.S. Appl. No. 11/579,536, filed Nov. 3, 2006, Mizushima, et al.
U.S. Appl. No. 11/579,821, filed Nov. 7, 2006, Mizushima, et al.
U.S. Appl. No. 11/556,835, filed Nov. 6, 2006, Mizushima, et al.
U.S. Appl. No. 11/953,325, filed Dec. 10, 2007, Kosuda, et al.
U.S. Appl. No. 11/964,464, filed Dec. 26, 2007, Hayashida, et al.
U.S. Appl. No. 12/021,686, filed Jan. 29, 2008, Kosuda, et al.
U.S. Appl. No. 12/061,971, filed Apr. 3, 2008, Hayashida, et al.
U.S. Appl. No. 12/109,000, filed Apr. 24, 2008, Kosuda, et al.
U.S. Appl. No. 11/847,730, filed Aug. 30, 2007, Kosuda, et al.
U.S. Appl. No. 11/847,831, filed Aug. 30, 2007, Hayashida, et al.
U.S. Appl. No. 11/847,819, filed Aug. 30, 2007, Yoshinari, et al.
U.S. Appl. No. 11/859,992, filed Sep. 24, 2007, Hayashida, et al.
T. Shimura, "Holographic Memory", O plus E, vol. 25, No. 4, 2003, pp. 385-390.
U.S. Appl. No. 12/236,123, filed Sep. 23, 2008, Yoshinari, et al.
U.S. Appl. No. 12/243,077, filed Oct. 1, 2008, Hayashida, et al.
U.S. Appl. No. 12/235,958, filed Sep. 23, 2008, Hayashida, et al.
U.S. Appl. No. 12/556,956, filed Sep. 10, 2009, Hayashida, et al.

* cited by examiner

HOLOGRAM RECORDING MATERIAL, AND HOLOGRAM RECORDING MEDIUM

BACKGROUND OF THE INVENTION

1. Field of the Invention

The present invention relates to a hologram recording material suitable for volume hologram recording, and a hologram recording medium comprising the hologram recording material.

2. Disclosure of the Related Art

Research and development of holographic memories have been advanced as large-capacity recording technique making high-speed transmission possible. O plus E, vol. 25, No. 4, 385-390 (2003) describes basic structures of holographic memories and a coming prospect thereof.

Examples of the property required for a hologram recording material include high refractive index change at the time of recording, high sensitivity, low scattering, environment resistance, durability, low dimensional change, and high multiplicity. As a hologram recording material, there is known a photopolymer material made mainly of an organic binder polymer and a photopolymerizable monomer. However, the photopolymer material has problems about environment resistance, durability and others. In order to solve the problems of the photopolymer material, attention has been paid to an organic-inorganic hybrid material made mainly of an inorganic matrix and a photopolymerizable monomer, and the hybrid material has been investigated. The inorganic matrix is excellent in environment resistance and durability.

For example, Japanese Patent No. 2953200 discloses a film for optical recording wherein a photopolymerizable monomer or oligomer and a photopolymerization initiator are contained in an inorganic substance network film. It is also disclosed that the brittleness of the inorganic network film is improved by modifying the inorganic network organically. However, the compatibility between the inorganic substance network and the photopolymerizable monomer or oligomer is bad. Therefore, a uniform film is not easily obtained. It is particularly difficult to form a uniform film when the film is made into a film thickness of 100 μm or more, which is necessary for attaining high multiplicity. The nonuniformity of the film causes a problem of light scattering. When the film thickness is 100 μm or more, the light scattering becomes a very serious problem. Specifically, the transmittance of the hologram recording material is lowered by the light scattering, and noises are generated in recorded data by scattered light. In the above publication, recording properties, such as scattering in a film having a thickness of 100 μm or more, are not investigated.

JP-A-11-344917 discloses an optical recording medium wherein an organic-inorganic hybrid matrix contains an optically active monomer. In the organic-inorganic hybrid matrix, a metal element has an alkyl group (a methyl group) or an aryl group (a phenyl group). However, the introduction of the methyl group makes it impossible to improve the compatibility between the hybrid matrix and the optically active monomer. The introduction of the phenyl group gives a more improvement in the compatibility than the introduction of the methyl group. However, the introduction of the phenyl group causes a fall in the curing speed of a hybrid matrix precursor ([0015] in the above publication).

JP-A-2002-236439 discloses a hologram recording material comprising: a matrix made of an organic-inorganic hybrid polymer obtained by copolymerizing an organometallic compound containing an ethylenically unsaturated double bond and an organic monomer having an ethylenically unsaturated double bond, and/or a hydrolyzed polycondensate thereof, as main chain constituting components; a photopolymerizable compound; and a photopolymerization initiator. By the introduction of the large organic main chain component into the matrix material, the compatibility between the matrix and the photopolymerizable compound is improved. However, the introduction of the large organic main chain component permits the presence of a two-component structure of the organic main chain and an inorganic network in the matrix material. Thus, it appears that the matrix may not exhibit unified behavior at the time of recording so as to cause nonuniform recording. If the ratio of the organic main chain component in the matrix is large, the same problems as in the case of the above-mentioned photopolymer material, which uses an organic binder polymer, are caused.

SUMMARY OF THE INVENTION

Thus, an object of the present invention is to provide a hologram recording material which attains high refractive index change, flexibility, high sensitivity, low scattering, environment resistance, durability, low shrinkage, and high multiplicity, and is suitable for volume hologram recording. In particular, an object of the present invention is to provide a hologram recording material which attains compatibility of high refractive index change, flexibility and high sensitivity with small recording shrinkage, and is suitable for volume hologram recording. Another object of the present invention is to provide a hologram recording medium comprising the hologram recording material.

The present inventors have made eager investigations to find out a hologram recording material having high refractive index change, flexibility, high sensitivity, small recording shrinkage, and excellent compatibility.

The present invention comprises the followings:

(1) A hologram recording material comprising:

an organometallic compound at least containing at least two kinds of metals, oxygen, and an aromatic group, and having an organometallic unit wherein two aromatic groups are bonded directly to one metal; and a photopolymerizable compound containing at least a monofunctional compound (A) having one polymerizable functional group in the molecule.

(2) The hologram recording material according to (1), which comprises, as the photopolymerizable compound, the monofunctional compound (A) having one polymerizable functional group in the molecule, and a polyfunctional compound (B) having two or more polymerizable functional groups in the molecule.

(3) The hologram recording material according to (1) or (2), wherein the monofunctional compound (A) having one polymerizable functional group in the molecule is contained in an amount of 70% or more by mole on the basis of an amount of the entire photopolymerizable compound.

(4) The hologram recording material according to any one of (1) to (3), wherein one of the at least two kinds of metals is Si, and the metal(s) other than Si is/are selected from the group consisting of Ti, Zr, Ge, Sn, Al and Zn.

(5) The hologram recording material according to (4), wherein Si and the metal(s) other than Si are bonded through the oxygen atom.

(6) The hologram recording material according to (4) or (5), wherein the organometallic unit is a unit wherein two aromatic groups are bonded directly to one Si atom.

(7) The hologram recording material according to any one of (4) to (6), wherein the aromatic group is a phenyl group.

(8) The hologram recording material according to any one of (4) to (7), wherein the number (p) of the phenyl group, the number (s) of the Si atom, and the number (m) of the metals other than Si which are contained in the organometallic compound satisfy the following relationship:

$s \leq p < 3s$, and $0.3s \leq m \leq 3s$.

(9) The hologram recording material according to any one of (1) to (8), further comprising a photopolymerization initiator.

(10) A hologram recording medium comprising the hologram recording material according to any one of (1) to (9).

According to the present invention, the organometallic compound which functions as a matrix or a dispersing medium for a photopolymerizable compound has an organometallic unit wherein two aromatic groups are bonded directly to one metal. Thus, there is provided a hologram recording material having good compatibility between the organometallic compound and the photopolymerizable compound, good compatibility between the organometallic compound and an organic polymer produced at the time of recording, and excellent flexibility. Further, the organometallic compound contains, as its constituting metals, at least two kinds of metals, and thus characteristics such as refractive index are easily controlled and the recording material is easily designed.

Furthermore, the photopolymerizable compound contains at least the monofunctional compound (A), which has in the molecule thereof one polymerizable functional group; therefore, about the hologram recording material of the present invention, the ratio of recording shrinkage, which is generated at the time of recording, is very small.

The hologram recording material of the present invention is used to provide a hologram recording medium having a recording film thickness of 100 μm or more, which is suitable for data storage.

DETAILED DESCRIPTION OF THE INVENTION

Figure 1:
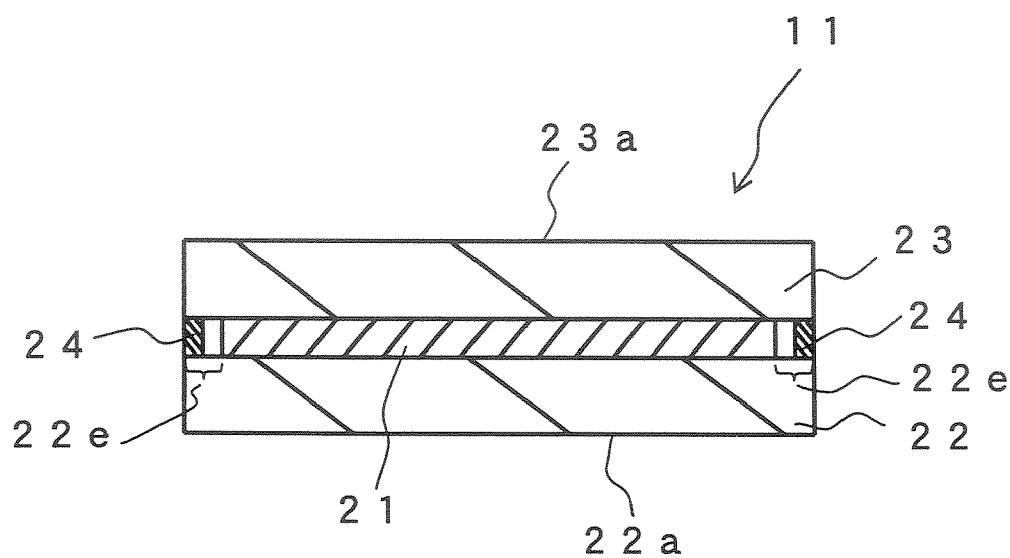
FIG. 1 is a view illustrating a schematic cross section of a hologram recording medium produced in examples.

The hologram recording material of the present invention is made of a composition comprising, as essential components, the organometallic compound and the photopolymerizable organic compound, and the organometallic compound at least contains at least two kinds of metals, oxygen, and an aromatic group, and has an organometallic unit wherein two aromatic groups are bonded directly to one metal. The organometallic compound has flexibility, and functions as a matrix or a dispersing medium for the photopolymerizable compound. In other words, the organometallic compound is in the form of gel or sol. In the organometallic compound, the photopolymerizable compound of a liquid phase is uniformly dispersed with good compatibility.

When light having coherency is irradiated onto this hologram recording material made into a film form, the photopolymerizable organic compound undergoes polymerization reaction in the exposed portion so as to be polymerized, and further the photopolymerizable organic compound diffuses and shifts from the unexposed portion into the exposed portion so that the polymerization of the exposed portion further advances. As a result, an area where the polymer produced from the photopolymerizable organic compound is large in amount and an area where the polymer is small in amount are formed in accordance with the intensity distribution of the light. At this time, the organometallic compound shifts from the area where the polymer is large in amount to the area where the polymer is small in amount, so that the area where the polymer is large in amount becomes an area where the organometallic compound is small in amount and the area where the polymer is small in amount becomes an area where the organometallic compound is large in amount. In this way, the light exposure causes the formation of the area where the polymer is large in amount and the area where the organometallic compound is large in amount. When a refractive index difference exists between the polymer and the organometallic compound, a refractive index change is recorded in accordance with the light intensity distribution.

In order to obtain a better recording property in the hologram recording material, it is necessary that a difference is large between the refractive index of the polymer produced from the photopolymerizable compound and that of the organometallic compound. The refractive indexes of the polymer and the organometallic compound may be designed so as to make any one of the refractive indexes high (or low). However, the organometallic compound has the introduced aromatic groups to have high refractive index; therefore, it is advisable to design the hologram recording material to make the refractive index of the organometallic compound high and make the refractive index of the polymer low.

Moreover, in order to obtain a better recording property in the hologram recording material, it is necessary that the diffusion/polymerization of the photopolymerizable compound is easily attained in the state that the photopolymerizable compound is present together with the organometallic compound. In the present invention, the organometallic compound has flexibility and functions as a matrix or a dispersing medium for the photopolymerizable compound so that the diffusion/polymerization of the photopolymerizable compound is easily attained. Thus, the refractive index change between the exposed portion and the unexposed portion becomes large by irradiation of light.

In the present invention, the organometallic compound at least contains at least two kinds of metals (M), oxygen, and an aromatic group (Ar), and has an organometallic unit (Ar-M-Ar) wherein two aromatic groups (Ar) are bonded directly to one metal (M). The metals (M) are bonded to each other through the oxygen atom. About the metals (M), two or more kinds of metals are arbitrarily selected from the group consisting of, for example, Si, Ti, Zr, Ge, Sn, Al and Zn. Only one kind of the selected two or more kinds of metals may constitute the organometallic unit, or the other kinds of metal(s) may also constitute the organometallic unit(s) of one or more different kinds. When the organometallic compound contains the two or more kinds of metals as its constituting metals, the characteristics such as refractive index are easily controlled so that the recording material is easily designed.

The organometallic compound is produced by hydrolysis and polymerization reaction, what is called sol-gel reaction, using alkoxide compounds of the corresponding two or more kinds of metals (M) and diarylalkoxide compounds of the metals (M) constituting the organometallic unit.

In the organometallic compound, it is preferred that one of the at least two kinds of metals (M) is Si and the metal(s) other than Si is/are one or more kind(s) arbitrarily selected from the group consisting of Ti, Zr, Ge, Sn, Al and Zn. Si and the metal(s) other than Si are bonded to each other through one or more oxygen atoms.

In the organometallic compound, it is preferred that the organometallic unit (Ar-M-Ar) is a unit (Ar—Si—Ar) wherein two aromatic groups are bonded directly to one Si atom. About the diarylalkoxide compound of Si, raw materials are available at ease. However, it is not excluded that aromatic groups are bonded directly to the metal other than Si.

In the organometallic compound, it is more preferred that the organometallic unit (Ar-M-Ar) is a unit (Ph-Si-Ph) wherein two phenyl groups (Ph) are bonded directly to one Si atom. About the diphneylalkoxide compound of Si, raw materials are available at ease, and the compound is good in reactivity for hydrolysis and polymerization. The phenyl groups may have a substituent.

The organometallic compound has an organometallic unit wherein two aromatic groups are bonded directly to one metal. Besides the organometallic unit, the organometallic compound may have an organometallic unit wherein one aromatic group is bonded directly to one metal, or may have an organometallic unit wherein three aromatic groups are bonded directly to one metal.

According to the introduction of the two aromatic groups (phenyl groups) into Si, the organometallic compound has good compatibility with the photopolymerizable compound described below and an organic polymer produced by the polymerization thereof. The refractive index of the organometallic compound also becomes high.

In order to make the organometallic compound so as to have high refractive index, it is preferred to use Ti as the metal other than Si.

Preferred examples of the organometallic compound in the present invention include (I) and (II) represented by the following chemical formulae. In the examples, the alkoxide of Si is methoxide, and the alkoxide of Ti is butoxide. It is evident that other alkoxides are also allowable.

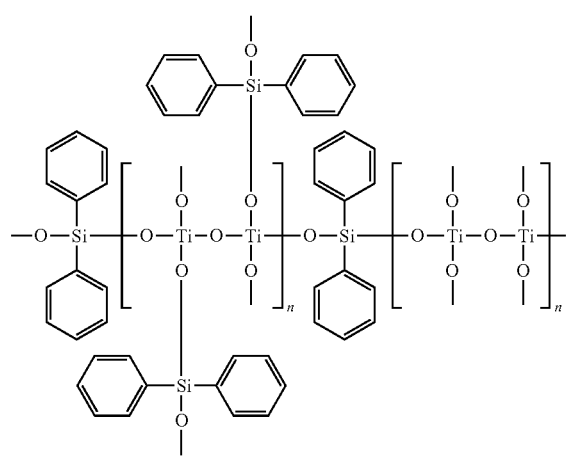

(I)

n = 5
Mw > 2,000

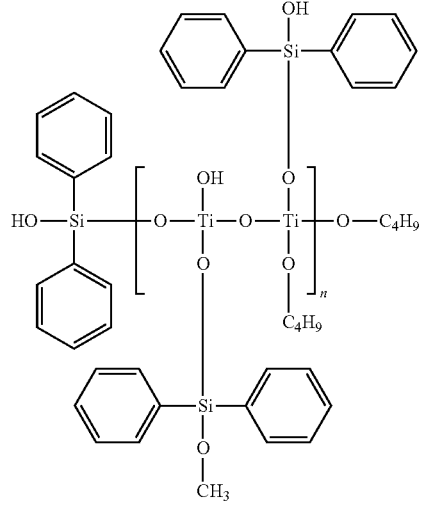

(II)

n = 5
Mw = ca. 1,600

These organometallic compounds can each be obtained by performing hydrolysis and polymerization reaction using a diphenylalkoxide compound of Si and an alkoxide compound of Ti. For example, the reaction formula in the case of using diphenyldimethoxysilane as the diphenylalkoxide compound of Si and a titanium butoxide oligomer as the alkoxide compound of Ti is represented by the following chemical formulae. The alkoxides of the both starting materials are hydrolyzed and then polymerized so that Si and Ti are bonded to each other through an oxygen atom. As a result, there can be obtained the organometallic compound containing Si and Ti as constituting metals, including diphenylsilane units, and having various molecular weights. In the chemical formulae, (I) and (II) are illustrated as examples of the organometallic compounds. That is, the organometallic compound is obtained in the form of a composition of organometallic compound variations having various molecular weights. This composition would include such compounds as a silane compound (III) containing no Ti.

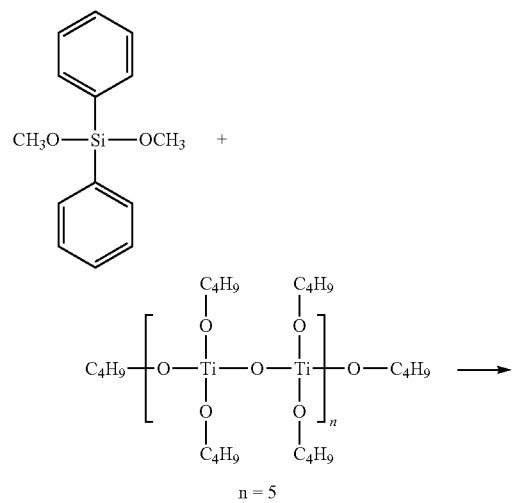

n = 5

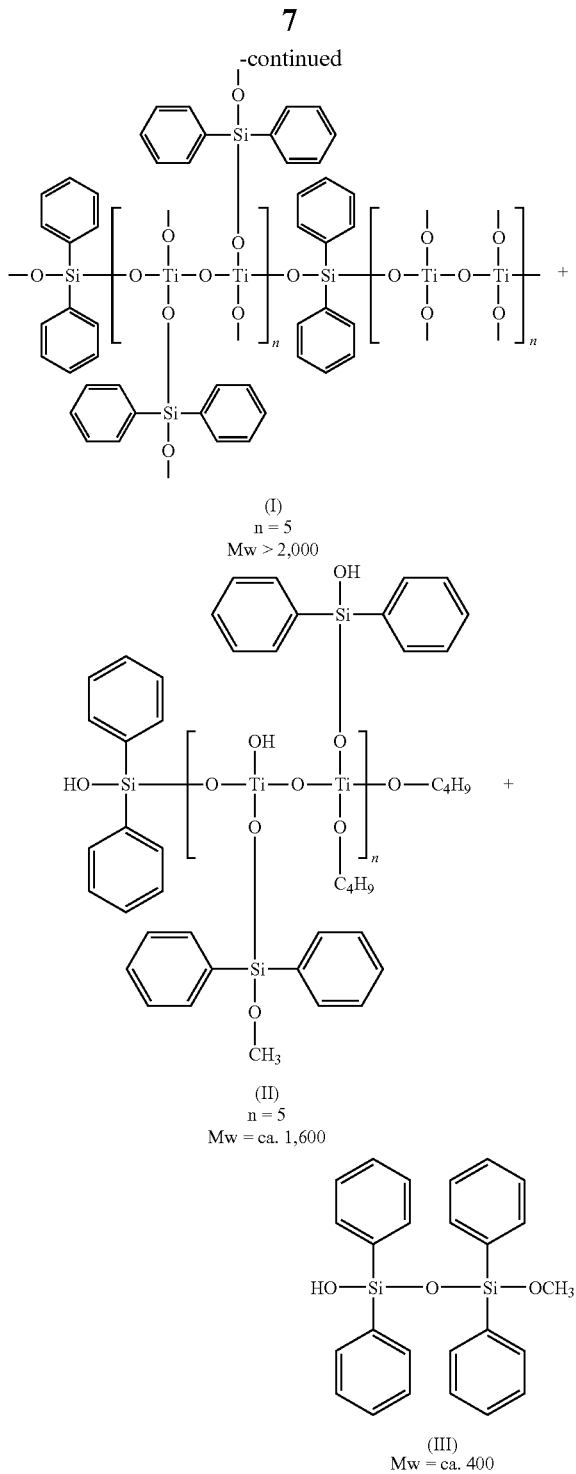

(I)
n = 5
Mw > 2,000

(II)
n = 5
Mw = ca. 1,600

(III)
Mw = ca. 400

In the present invention, it is preferred that the number (p) of the phenyl group, the number (s) of the Si atom, and the number (m) of the metals other than Si which are contained in the organometallic compound satisfy the following relationship in the above-mentioned organometallic compound composition:

$s \leq p < 3s$, and $0.3s \leq m \leq 3s$.

Specifically, it is preferred that one or more and less than three phenyl groups are bonded to one Si atom, as the whole of the organometallic compound composition, from the viewpoint of the compatibility with the photopolymerizable compound and an organic polymer produced by the polymerization thereof. It is also preferred that the number (m) of the metals other than Si, such as Ti, is within the above-mentioned range in relative to the number (s) of the Si atom. If the number (m) of the other metals is less than 0.3s, the effects of the inclusion of the two or more kinds of metals into the organometallic compound, that is, the effect that the characteristics, such as the refractive index, are easily controlled becomes small. On the other hand, if the number (m) of the other metals is more than 3s, the organometallic compound comes to have the nature of an inorganic matrix easily as the whole of the compound so that the compatibility or flexibility falls.

In the present invention, an organic group other than the aromatic groups, for example, an alkyl group may be introduced into Si in the organometallic compound. For example, methylphenyldimethoxysilane or the like can be used as long as the advantageous effects of the present invention are not damaged. When a monoalkoxysilane such as trimethylmethoxysilane is present, the polymerization reaction is terminated. Accordingly, the monoalkoxysilane can be used to adjust the molecular weight.

The organometallic compound may contain trace amounts of elements other than the above.

In the present invention, the photopolymerizable compound is a photopolymerizable monomer. As the photopolymerizable compound, the hologram recording material contains at least a monofunctional compound (A) having in the molecule thereof one polymerizable functional group, and may further contain a polyfunctional compound (B) having in the molecule thereof two or more polymerizable functional groups. As the monofunctional or polyfunctional photopolymerizable compound, a compound selected from a radical polymerizable compound and a cation polymerizable compound can be used.

The radical polymerizable compound is not particularly limited as long as the compound has in the molecule one, or two or more radical polymerizable unsaturated double bonds. For example, a compound having a (meth)acryloyl group or a vinyl group can be used. The wording "(meth)acryloyl group" is a wording for expressing a methacryloyl group and an acryloyl group collectively.

Examples of the monofunctional compound having one (meth)acryloyl group, out of the radical polymerizable compounds, include phenoxyethyl (meth)acrylate, 2-methoxyethyl (meth)acrylate, 2-hydroxyethyl (meth)acrylate, benzyl (meth)acrylate, cyclohexyl (meth)acrylate, ethoxydiethylene glycol (meth)acrylate, methoxypolyethylene glycol (meth)acrylate, methyl (meth)acrylate, polyethylene glycol (meth)acrylate, polypropylene glycol (meth)acrylate, and stearyl (meth)acrylate. However, the monofunctional compound is not necessarily limited thereto.

Examples of the polyfunctional compound having two or more (meth)acryloyl groups, out of the radical polymerizable compounds, include trimethylolpropane tri(meth)acrylate, pentaerythritol tetra(meth)acrylate, dipentaerythritol hexa(meth)acrylate, diethylene glycol di(meth)acrylate, triethylene glycol di(meth)acrylate, tetraethylene glycol di(meth)acrylate, polyethylene glycol di(meth)acrylate, bis(2-hydroxyethyl)isocyanurate di(meth)acrylate, and 2,2-bis[4-(acryloxy-diethoxy)phenyl]propane. However, the polyfunctional compound is not necessarily limited thereto.

Examples of the monofunctional compound which has one vinyl group include monovinylbenzene, and ethylene glycol monovinyl ether. However, the monofunctional compound is not necessarily limited thereto Examples of the polyfunctional compound which has two or more vinyl groups include divinylbenzene, ethylene glycol divinyl ether, diethylene glycol divinyl ether, and triethylene glycol divinyl ether. However, the polyfunctional compound is not necessarily limited thereto.

One kind of the monofunctional radical polymerizable compound may be used, and two or more kinds thereof are used together. In the case of using both of the monofunctional radical polymerizable compound and the polyfunctional radical polymerizable compound, one kind of the polyfunctional radical polymerizable compound may be used, and two or more kinds thereof are used together.

In the case of making the refractive index of the organometallic compound high and making the refractive index of the organic polymer low, in the present invention, a compound having no aromatic group to have low refractive index (for example, refractive index of 1.5 or less) is preferred out of the above-mentioned radial polymerizable compounds. In order to make the compatibility with the organometallic compound better, preferred is a more hydrophilic glycol derivative, such as polyethylene glycol (meth)acrylate, polypropylene glycol (meth)acrylate, or polyethylene glycol di(meth)acrylate.

The cation polymerizable compound is not particularly limited about the structure, as long as the compound has at least one reactive group selected from a cyclic ether group and a vinyl ether group, and the number of the selected groups is one, or two or more in the molecule of the compound.

Examples of the compound having a cyclic ether group out of the cation polymerizable compounds include compounds having an epoxy group, an alicyclic epoxy group or an oxetanyl group.

Specific examples of the monofunctional compound having one epoxy group include 1,2-epoxyhexadecane, and 2-ethylhexyldiglycol glycidyl ether. Specific examples of the polyfunctional compound having two or more epoxy groups include bisphenol A diglycidyl ether, novolak type epoxy resins, trisphenolmethane triglycidyl ether, 1, 4-butanedioldiglycidyl ether, 1,6-hexanediol diglycidyl ether, glycerin triglycidyl ether, trimethylolpropane triglycidyl ether, propylene glycol diglycidyl ether, and polyethylene glycol diglycidyl ether.

Specific examples of the monofunctional compound having one alicyclic epoxy group include 1,2-epoxy-4-vinylcyclohexane, D-2,2,6-trimethyl-2,3-epoxybicyclo[3,1,1]heptane, and 3,4-epoxycyclohexylmethyl (meth)acrylate. Specific examples of the polyfunctional compound having two or more alicyclic epoxy groups include 2,4-epoxycyclohexylmethyl-3,4-epoxycyclohexane carboxylate, bis(3,4-epoxycyclohexylmethyl) adipate, 2-(3,4-epoxycyclohexyl-5,5-spiro-3,4-epoxy)cyclohexanone-m-dioxane, bis(2,3-epoxycyclopentyl) ether, and EHPE-3150 (alicyclic epoxy resin, manufactured by Dicel Chemical Industries, Ltd.).

Specific examples of the monofunctional compound having one oxetanyl group include 3-ethyl-3-hydroxymethyloxetane, 3-ethyl-3-(2-ethylhexyloxymethyl)oxetane, and 3-ethyl-3-(cyclohexyloxymethyl)oxetane. Specific examples of the polyfunctional compound having two or more oxetanyl group include 1,4-bis[(3-ethyl-3-oxetanylmethoxy)methyl] benzene, 1,3-bis[(3-ethyl-3-oxetanylmethoxy)methyl]propane, ethylene glycol bis(3-ethyl-3-oxetanylmethyl) ether, trimethylolpropanetris(3-ethyl-3-oxetanylmethyl) ether, pentaerythritol tetrakis(3-ethyl-3-oxetanylmethyl) ether, dipentaerythritol hexakis(3-ethyl-3-oxetanylmethyl) ether, and ethylene oxide modified bisphenol A bis(3-ethyl-3-oxetanylmethyl) ether.

Specific examples of the monofunctional compound having one vinyl ether group, out of the cation polymerizable compounds, include triethylene glycol monovinyl ether, cyclohexanedimethanol monovinyl ether, and 4-hydroxycyclohexyl vinyl ether. Specific examples of the polyfunctional compound having two or more vinyl ether groups include triethylene glycol divinyl ether, tetraethylene glycol divinyl ether, trimethylolpropane trivinyl ether, cyclohexane-1,4-dimethylol divinyl ether, 1,4-butanediol divinyl ether, polyester divinyl ether, and polyurethane polyvinyl ether.

One kind of the monofunctional cation polymerizable compound may be used, and two or more kinds thereof are used together. In the case of using both of the monofunctional cation polymerizable compound and the polyfunctional cation polymerizable compound, one kind of the polyfunctional cation polymerizable compound may be used, and two or more kinds thereof are used together. As the photopolymerizable compound, an oligomer of the cation polymerizable compounds exemplified above may be used.

In the case of making the refractive index of the organometallic compound high and making the refractive index of the organic polymer low, in the present invention, a compound having no aromatic group to have low refractive index (for example, refractive index of 1.5 or less) is preferred out of the above-mentioned cation polymerizable compounds. In order to make the compatibility with the organometallic compound better, preferred is a more hydrophilic glycol derivative, such as 2-ethylhexyl diglycol glycidyl ether, or polyethylene glycol diglycidyl ether.

It is advisable that in the present invention the photopolymerizable compound is used, for example, in an amount of about 5 to 1000% by weight of the total of the organometallic compound, preferably in an amount of 10 to 300% by weight thereof. If the amount is less than 5% by weight, a large refractive index change is not easily obtained at the time of recording. If the amount is more than 1000% by weight, a large refractive index change is not easily obtained, either, at the time of recording.

In the present invention, when the monofunctional compound (A), which has one polymerizable functional group in the molecule, is used as the photopolymerizable compound, the degree of recording shrinkage, which is generated at the time of recording, in the hologram recording material can be restrained. In other words, the crosslinking density of the hologram recording material based on photopolymerization thereof at the time of recording is restrained so that the material gives a low recording shrinkage. In order to restrain the degree of recording shrinkage, the monofunctional compound (A) is contained in the hologram recording material preferably in an amount of 70% or more by mole of the entire photopolymerizable compound, more preferably in an amount of 80% or more by mole thereof. As the photopolymerizable compound, only the monofunctional compound (A) may be used (100% by mole). Accordingly, it is preferred to use the polyfunctional compound (B), which has two or more polymerizable functional groups in the molecule, in an amount of 30% or less by mole. As the degree of the recording shrinkage becomes larger, the efficiency of reproduction after the recording tends to be lower.

On the other hand, if the crosslinking density based on photopolymerization at the time of the recording becomes too low, polymerization reaction does not advance easily. It is therefore preferred to use the polyfunctional compound (B) together with the monofunctional compound (A). Thus, the blend ratio between the monofunctional compound (A) and the polyfunctional compound (B) should be appropriately selected. For example, the amount of the monofunctional compound (A) may be set to 70% or more by mole and 90% or less by mole of the entire photopolymerizable compound, and the amount of the polyfunctional compound (B) may be set to 10% or more by mole and 30% or less by mole thereof. When the monofunctional compound (A) and the polyfunctional compound (B) are used together at an appropriate blend ratio, a more preferred hologram recording material wherein a high refractive index change, a high sensitivity, and a small recording shrinkage are attained can be obtained.

In the present invention, it is preferred that the hologram recording material further contains a photopolymerization initiator corresponding to the wavelength of recording light. When the photopolymerization initiator is contained in the hologram recording material, the polymerization of the photopolymerizable compound is promoted by the light exposure at the time of recording. Consequently, a higher sensitivity is achieved.

When a radical polymerizable compound is used as the photopolymerizable compound, a photo radical initiator is used. On the other hand, when a cation polymerizable compound is used as the photopolymerizable compound, a photo cation initiator is used.

Examples of the photo radical initiator include Darocure 1173, Irgacure 784, Irgacure 651, Irgacure 184 and Irgacure 907 (each manufactured by Ciba Specialty Chemicals Inc.). The content of the photo radical initiator is, for example, about 0.1 to 10% by weight, preferably about 0.5 to 5% by weight on the basis of the radical polymerizable compound.

As the photo cation initiator, for example, an onium salt such as a diazonium salt, a sulfonium salt, or a iodonium salt can be used. It is particularly preferred to use an aromatic onium salt. Besides, an iron-arene complex such as a ferrocene derivative, an arylsilanol-aluminum complex, or the like can be preferably used. It is advisable to select an appropriate initiator from these. Specific examples of the photo cation initiator include Cyracure UVI-6970, Cyracure UVI-6974 and Cyracure UVI-6990 (each manufactured by Dow Chemical Co. in USA), Irgacure 264 and Irgacure 250 (each manufactured by Ciba Specialty Chemicals Inc.), and CIT-1682 (manufactured by Nippon Soda Co., Ltd.). The content of the photo cation initiator is, for example, about 0.1 to 10% by weight, preferably about 0.5 to 5% by weight on the basis of the cation polymerizable compound.

It is preferred that the photopolymerization initiator contains a dye or the like that functions as a sensitizer corresponding to the wavelength of recording light besides the initiator.

It is preferred that the photopolymerization initiator is decomposed in order to stabilize hologram recording after the recording. Usually, the initiator is decomposed by sufficient irradiation of light after the recording.

The following will describe the production of the hologram recording material.

First, the above-mentioned organometallic compound is prepared by hydrolysis and polymerization reaction such as a sol-gel process or the like. For example, a diphenylalkoxide compound of Si and an alkoxide compound of Ti are used as starting materials, and the both starting materials are subjected to hydrolysis and polymerization reaction, thereby yielding a composition of the organometallic compound containing Si and Ti as constituting metals, including diphenylsilane units, and having various molecular weights.

The hydrolysis and polymerization reaction can be carried out according to almost the same operations and conditions as in known sol-gel processes. For example, the metal alkoxide compounds (the diphenylalkoxide compound of Si and the alkoxide compound of Ti), as the starting materials, the ratio therebetween being the determined ratio, are dissolved into an appropriate good solvent to prepare a homogeneous solution. An appropriate acid catalyst is dropped into the solution. The solution is stirred in the presence of water, whereby the reaction can be conducted.

Examples of such a solvent include: water; alcohols such as methanol, ethanol, propanol, isopropanol, and butanol; ethers such as diethyl ether, dioxane, dimethoxyethane and tetrahydrofuran; and N-methylpyrrolidone, acetonitrile, dimethylformamide, dimethylacetoamide, dimethylsulfoxide, acetone, benzene, and the like. The solvent may be appropriately selected from these. Alternatively, a mixture of these may be used. The amount of the solvent is not limited, and is preferably 10 to 1000 parts by weight with respect to 100 parts by weight of the whole of the metal alkoxide compound.

Examples of the acid catalyst include: inorganic acids such as hydrochloric acid, sulfuric acid, nitric acid and phosphoric acid; organic acids such as formic acid, acetic acid, trichloroacetic acid, trifluoroacetic acid, propionic acid, methanesulfonic acid, ethanesulfonic acid, and p-toluenesulfonic acid; and the like.

The hydrolysis polymerization reaction can be generally conducted at room temperature, which depends on the reactivity of the metal alkoxide compounds. The reaction can be conducted at a temperature of about 0 to 150° C., preferably at a temperature of about room temperature to 50° C. The reaction time may be appropriately determined, correspondingly to the relationship with the reaction temperature. The time is about 0.1 to 240 hours. The reaction may be conducted in an inert atmosphere such as nitrogen gas, or may be conducted under a reduced pressure of about 0.5 to 1 atom while the alcohol produced by the polymerization reaction is removed.

Before or after the hydrolysis, the photopolymerizable organic compound is mixed. The photopolymerizable organic compound may be mixed with the metal alkoxide compounds as the starting materials after or before the hydrolysis. In the case of the mixing after the hydrolysis, it is preferred to add and mix the photopolymerizable organic compound in the state that the sol-gel reaction system containing the organometallic compound is sol in order to perform the mixing uniformly. The mixing of a photopolymerization initiator can also be conducted before or after the hydrolysis.

A hologram recording material solution is obtained wherein the photopolymerizable organic compound and the sol-state organometallic compound are uniformly mixed. The hologram recording material solution is applied onto a substrate, and then the drying of the solvent and sol-gel reaction are advanced, thereby yielding a film-form hologram recording material. In such a way, the hologram recording material is produced wherein the photopolymerizable organic compound is uniformly contained in the specific organometallic compound.

Since the organometallic compound, which has an organometallic unit wherein two aromatic groups are bonded directly to one metal, is used as a matrix or a dispersing medium for the photopolymerizable compound in the present invention, the organometallic compound is very good in compatibility with the photopolymerizable compound at any stage in the production of the above-mentioned hologram recording material. In other words, the compatibility between the sol-state organometallic compound and the photopolymerizable compound is very good, and the compatibility between the cured organometallic compound and the photopolymerizable compound is also very good. The hologram recording material of the present invention is also good in flexibility. For the reasons, the material can be applied to a hologram recording medium in various forms. Furthermore, the organometallic compound contains two or more kinds of metals as constituting metals, whereby the characteristics such as refractive index are easily controlled and thus the recording material is easily designed.

When the hologram recording material of the present invention is used, a hologram recording medium having a recording layer thickness of 100 μm or more, which is suitable for data storage, can be obtained. The hologram recording medium can be produced by forming the hologram recording material in a film form onto a substrate, or sandwiching the hologram recording material in a film form between substrates. It is preferred to use, for the substrate(s), a material transparent to a recording/reproducing wavelength, such as glass or resin. It is preferred to form an antireflection film against the recording/reproducing wavelength for preventing noises or give address signals and so on, onto the substrate surface at the side opposite to the layer of the hologram recording material. In order to prevent interface reflection, which results in noises, it is preferred that the refractive index of the hologram recording material and that of the substrate are substantially equal to each other. It is allowable to form, between the hologram recording material layer and the substrate, a refractive index adjusting layer comprising a resin material or oil material having a refractive index substantially equal to that of the recording material or the substrate. In order to keep the thickness of the hologram recording material layer between the substrates, a spacer suitable for the thickness between the substrates may be arranged. End faces of the recording material medium are preferably subjected to treatment for sealing the recording material.

According to the hologram recording medium of the present invention, the recording film is uniform; thus, a problem of light scattering is not caused. At the time of recording, the photopolymerizable organic compound is turned into a polymer in the exposed portion; the organometallic compound has the organometallic unit, wherein two aromatic groups are bonded directly to one metal, so that the organometallic compound is very good compatible with the polymer. Therefore, according to the hologram recording medium of the present invention, the compatibility is sufficiently kept and problems of light scattering and a fall in the transmittance are not caused when or after recording is performed.

EXAMPLES

The present invention will be more specifically described byway of the following examples. However, the present invention is not limited to these examples.

Example 1

Diphenyldimethoxysilane, and a titanium butoxide oligomer represented by the following structural formula were used to produce a hologram recording material in accordance with steps described below by a sol-gel process.

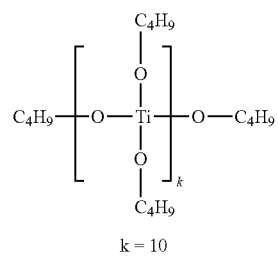

k = 10

(Synthesis of an Organometallic Compound)

In 4.7 mL of a solvent of tetrahydrofuran, 5.2 g of diphenyldimethoxysilane and 4.8 g of a titanium butoxide oligomer (B-10, manufactured by Nippon Soda Co., Ltd.) were mixed to prepare an alkoxide solution. The mole ratio of Si to Ti was 1:1.

A solution composed of 0.6 mL of water, 0.24 mL of a 2 N hydrochloric acid solution in water, and 4 mL of tetrahydrofuran was dropped into the alkoxide solution at room temperature while the solution was stirred. Stirring was continued for 2 hours to conduct hydrolysis reaction. In this way, there was obtained a sol solution of an organometallic compound, comprising Si, Ti and phenyl groups at the following mole ratio:

Si:Ti:phenyl groups=1:1:2 (mole ratio).

(Photopolymerizable Compound)

3.4 parts by weight of IRG-784 (Ciba Specialty Chemicals Inc.) as a photopolymerization initiator were incorporated into 100 parts by weight of methoxypolyethylene glycol acrylate (LIGHT-ESTER 130A, manufactured by Kyoeisha Chemical Co., Ltd.) as a photopolymerizable compound, and then mixed.

(Hologram recording material solution)

The sol solution and the photopolymerizable compound were mixed at room temperature to set the ratios of the organometallic compound (as a nonvolatile component) and the photopolymerizable compound to 80 parts by weight and 20 parts by weight, respectively, to yield a yellow transparent hologram recording material solution.

(Hologram Recording Material)

Description is made with reference to FIG. 1 illustrating a schematic sectional view of a hologram recording medium.

A glass substrate (22) having one surface on which an anti-reflection film (22a) was formed was prepared. The resultant hologram recording material solution was applied onto the surface of the glass substrate (22) where the anti-reflection film (22a) was not formed except an end portion (22e) of the substrate, so as to give a dry film thickness of 300 μm. The resultant was dried at 40° C. for 24 hours to volatilize the solvent. Through this drying step, the gelation (polymerization reaction) of the organometallic compound was advanced to yield a hologram recording material layer (21) wherein the organometallic compound and the photopolymerizable compound were uniformly dispersed.

(Hologram Recording Medium)

A spacer (24) of 300 μm thickness was put on the end portion (22e) of the glass substrate (22) on which the hologram recording material layer (21) was formed, and then the hologram recording material layer (21) was covered with another glass substrate (23) on one surface of which an anti-reflection film (23a) was formed. At this time, the covering was performed to bring the surface of the glass substrate (23) on which the anti-reflection film (23a) was not formed into contact with the surface of the hologram recording material layer (21). This manner gave a hologram recording medium

(11) having a structure that the hologram recording material layer (21) was sandwiched between the two glass substrates (22) and (23).

Examples 2-5

(Photopolymerizable Compounds)

As photopolymerizable compounds in Examples 2 to 5, methoxypolyethylene glycol acrylate (LIGHT-ESTER 130A, manufactured by Kyoeisha Chemical Co., Ltd.) and polyethylene glycol diacrylate (M-245, manufactured by Toagosei Co., Ltd.) were used at the following mole ratios:

methoxypolyethylene glycol acrylate:polyethylene glycol diacrylate=90:10 (Example 2), 80:20 (Example 3), 70:30 (Example 4), and 60:40 (Example 5).

To 100 parts by weight of the photopolymerizable compound having the above-mentioned mole ratio were added 3.4 parts by weight of IRG-784 (manufactured by Ciba Specialty Chemicals Inc.) as a photopolymerization initiator, and then mixed.

Almost the same operations as in Example 1 were conducted except that the photopolymerizable compound was changed as described above, so as to yield each hologram recording material solution and produce each hologram recording medium.

Reference Comparative Example (Photopolymerizable Compound)

3.4 parts by weight of IRG-784 (Ciba Specialty Chemicals Inc.) as a photopolymerization initiator were incorporated into 100 parts by weight of polyethylene glycol diacrylate (M-245, manufactured by Toagosei Co., Ltd.) as a photopolymerizable compound, and then mixed.

Almost the same operations as in Example 1 were conducted except that the photopolymerizable compound was changed as described above, so as to yield a hologram recording material solution and produce a hologram recording medium.

(Characteristic Evaluation)

Figure 2:
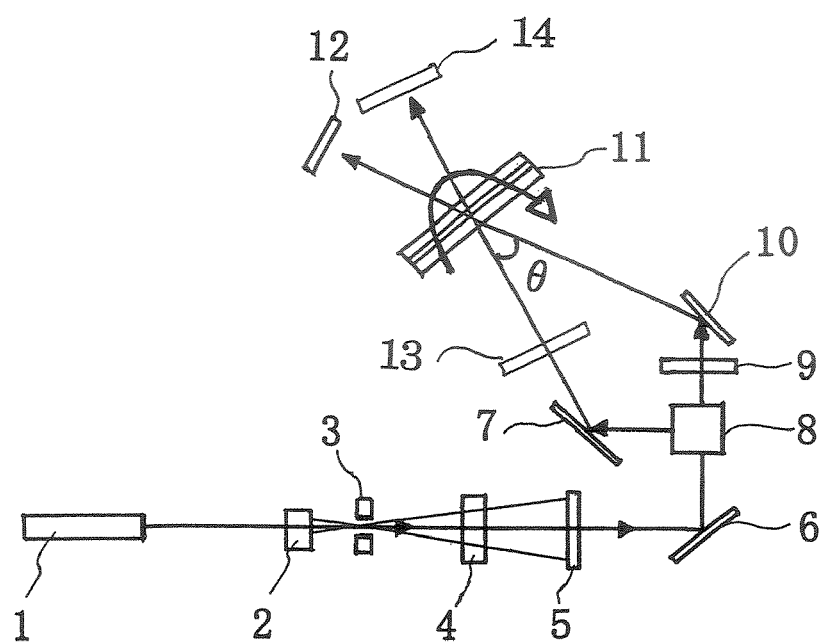
FIG. 2 is a plane view illustrating the outline of a hologram recording optical system used in the examples.

About the resultant hologram recording medium samples, characteristics were evaluated in a hologram recording optical system as illustrated in FIG. 2.

Dynamic Range:

In the hologram recording optical system in FIG. 2, a light source (1) of Nd:YAG laser (532 nm) was used, and light oscillated from the light source (1) was spatially filtered and collimated through a lens (2), a pin hole (3), a shutter (4) and a lens (5). The light was split with a beam splitter (8) to set the total incident angle θ of the two beams of light to the hologram recording medium sample (11) into 53.2°. The interference of the two beams of light was recorded with the sample (11). The sample (11) was rotated in the horizontal direction to do the angle multiplexing, thereby recording a hologram (sample angle: −24° to +24°, angle interval: 3°, and 17-piece multiplicity). After the recording of the hologram, only one beam of light was sufficiently irradiated thereto in order to cause the remaining unreacted components to react. About reproduction, a shutter (9) was used to irradiate only one beam of light thereto, and the diffraction efficiency was measured with a power meter (12) while the sample (11) was rotated. Dynamic range: M# was calculated as the sum of square roots of values of the diffraction efficiency. In FIG. 2, reference numerals (6), (7) and (10) denote mirrors.

Recording Shrinkage Ratio:

With reference to FIG. 2, the angle of a sample (11) was fixed to −21°, and then interference of two beams of light was recorded. About reproduction, the shutter (9) was used, and only one beam of light was irradiated. While the sample (11) was rotated, a change in the diffraction efficiency depending on angle was measured with the power meter (12), thereby obtaining the angle at which the diffraction efficiency became largest. Similarly, a shutter (13) was used, and only one beam of light was irradiated. While the sample (11) was rotated, a change in the diffraction efficiency depending on angle was measured with a power meter (14), thereby obtaining the angle at which the diffraction efficiency became largest.

The recording shrinkage was calculated, using the following expression described below, from a change amount of the angle at the time of recording and the angle at which the diffraction efficiency became largest after the recording. Such a method for obtaining the recording shrinkage is described in, for example, "Holographic Data Storage (Springer)", or Japanese Patent No. 3473950, paragraphs [0044]-[0050] and FIG. 1 in detail.

$$Kz=2\pi/\lambda[(n^2-\sin^2\Omega 1)^{1/2}-(n^2-\sin^2\Omega 2)^{1/2}]$$

wherein:
Kz=the z component of grating vector,
n: the refractive index of a material=1.58,
Ω1: the incidence angle of laser light 1=5.6° at the time of recording,
Ω2: the incidence angle of laser light 2=47.6° at the time of recording, and
λ: the wavelength=532 nm.

According to the above-mentioned expression, the Z component of grating vector at the time of recording is obtained.

From angles Ω1' and Ω2' at which the diffraction efficiency becomes largest at the time of reproduction, the Z component Kz' of grating vector at the time of the reproduction is obtained.

The difference between the Z component Kz of the grating vector at the time of the recording and the Z component Kz' of the grating vector at the time of the reproduction corresponds to the recording shrinkage amount.

The recording shrinkage ratio is a value obtained by dividing the recording shrinkage amount by the Z component Kz of the grating vector at the time of the recording, and is calculated out from the following expression.

$$\text{Recording shrinkage ratio (\%)}=[(Kz-Kz')/Kz]\times 100$$

The above-mentioned results are shown in Table 1. From Table 1, it can be understood that a small recording shrinkage can be attained by using a monofunctional photopolymerizable compound.

TABLE 1

| | Photopolymerizable compound Mole ratio Monofunctional A: Bifunctional B | Dynamic range M# | Recording shrinkage ratio (%) |
|---|---|---|---|
| Example 1 | 100:0 | 7.3 | 0.2 |
| Example 2 | 90:10 | 9.1 | 0.3 |
| Example 3 | 80:20 | 10.5 | 0.5 |
| Example 4 | 70:30 | 12.3 | 0.7 |
| Example 5 | 60:40 | 14.5 | 1.3 |
| Reference Comparative Example | 0:100 | 17.1 | 1.9 |

What is claimed is:

1. A hologram recording material comprising:
an organometallic compound comprising at least two kinds of metals, oxygen, and an aromatic group, and having an organometallic unit wherein two aromatic groups are bonded directly to one metal, which organometallic compound is obtained from starting compounds excluding compounds having an ethylenically unsaturated double bond; and a photopolymerizable compound comprising at least a monofunctional compound (A) having one polymerizable functional group in the molecule, wherein the photopolymerizable compound is a photopolymerizable organic monomer;

wherein one of the at least two different metals is Si, and the metal(s) other than Si is/are selected from the group consisting of Ti, Zr, Ge, Sn, Al and Zn;

wherein Si and the metal(s) other than Si are bonded through the oxygen atom; and wherein the organometallic unit is a unit wherein two aromatic groups are bonded directly to one Si atom.

2. The hologram recording material according to claim 1, which comprises, as the photopolymerizable compound, the monofunctional compound (A) having one polymerizable functional group in the molecule, and a polyfunctional compound (B) having two or more polymerizable functional groups in the molecule.

3. The hologram recording material according to claim 1, wherein the monofunctional compound (A) having one polymerizable functional group in the molecule is contained in an amount of 70% or more by mole on the basis of an amount of the entire photopolymerizable compound.

4. The hologram recording material according to claim 1, wherein the aromatic group is a phenyl group.

5. The hologram recording material according to claim 4, wherein the number (p) of the phenyl group, the number (s) of the Si atom, and the number (m) of the metals other than Si which are contained in the organometallic compound satisfy the following relationship:

$s \leq p < 3s$, and $0.3s \leq m \leq 3s$.

6. The hologram recording material according to claim 1, further comprising a photopolymerization initiator.

7. A hologram recording medium comprising the hologram recording material of claim 1 on a substrate.

8. The hologram recording material according to claim 1, wherein the organometallic compound is obtained by hydrolysis and polymerization reaction of components comprising a diphenylalkoxide of Si and a monomeric or oligomeric alkoxide of the metal(s) other than Si.

9. The hologram recording material according to claim 8, wherein the metal other than Si is Ti.

* * * * *